(12) United States Patent
Berke et al.

(10) Patent No.: US 10,612,151 B2
(45) Date of Patent: Apr. 7, 2020

(54) FLOW ASSISTED DYNAMIC SEAL FOR HIGH-CONVECTION, CONTINUOUS-ROTATION PLATING

(71) Applicant: Lam Research Corporation, Fremont, CA (US)

(72) Inventors: Aaron Berke, Portland, OR (US); Stephen J. Banik, Portland, OR (US); Bryan Buckalew, Tualatin, OR (US); Robert Rash, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/044,412

(22) Filed: Jul. 24, 2018

(65) Prior Publication Data

US 2019/0264347 A1    Aug. 29, 2019

Related U.S. Application Data

(60) Provisional application No. 62/636,818, filed on Feb. 28, 2018.

(51) Int. Cl.
*C25D 17/00* (2006.01)
*H01L 21/687* (2006.01)
(Continued)

(52) U.S. Cl.
CPC ............. *C25D 17/004* (2013.01); *C25D 7/12* (2013.01); *C25D 17/001* (2013.01); *C25D 21/04* (2013.01);
(Continued)

(58) Field of Classification Search
CPC ............................. C25D 17/001; C25D 7/123
See application file for complete search history.

(56) References Cited

U.S. PATENT DOCUMENTS

| 2004/0074761 A1 | 4/2004 | Herchen et al. |
| 2016/0186355 A1 | 6/2016 | Feng et al. |
| (Continued) | | |

FOREIGN PATENT DOCUMENTS

JP    5668650 B2    2/2015

OTHER PUBLICATIONS

International Patent Appln. No. PCT/US2019/019299, International Search Report and Written Opinion of the International Searching Authority, dated Jun. 11, 2019.

*Primary Examiner* — Brian W Cohen
*Assistant Examiner* — Ho-Sung Chung
(74) *Attorney, Agent, or Firm* — Penilla IP, APC

(57) ABSTRACT

An apparatus for electroplating a semiconductor wafer includes an insert member configured to circumscribe a processing region. The insert member has a top surface. A portion of the top surface of the insert member has an upward slope that slopes upward from a peripheral area of the top surface of the insert member toward the processing region. The apparatus also includes a seal member having an annular-disk shape. The seal member is positioned on the top surface of the insert member. The seal member is flexible such that an outer radial portion of the seal member conforms to the upward slope of the top surface of the insert member and such that an inner radial portion of the seal member projects inward toward the processing region.

14 Claims, 9 Drawing Sheets

(51) Int. Cl.
*C25D 21/14* (2006.01)
*C25D 21/04* (2006.01)
*C25D 7/12* (2006.01)
*H01L 21/288* (2006.01)

(52) U.S. Cl.
CPC .......... *C25D 21/14* (2013.01); *H01L 21/2885* (2013.01); *H01L 21/68721* (2013.01)

(56) References Cited

U.S. PATENT DOCUMENTS

| | | | |
|---|---|---|---|
| 2016/0201212 A1* | 7/2016 | Ostrowski | C25D 17/004 204/297.01 |
| 2016/0222535 A1 | 8/2016 | Zhou et al. | |
| 2017/0009370 A1 | 1/2017 | Chua et al. | |
| 2017/0342583 A1* | 11/2017 | Thorkelsson | C25D 7/126 |

* cited by examiner

1201

Having an electroplating apparatus that includes:
- an insert member configured to circumscribe a processing region, the insert member having a top surface, a portion of the top surface of the insert member having an upward slope that slopes upward from a peripheral area of the top surface of the insert member toward the processing region,
- a seal member having an annular-disk shape, the seal member positioned on the top surface of the insert member, the seal member being flexible such that an outer radial portion of the seal member conforms to the upward slope of the top surface of the insert member and such that an inner radial portion of the seal member projects toward the processing region,
- a cup member having an annular shape, the cup member having a bottom surface that includes an outer radial portion configured to form a liquid seal with a top surface of the inner radial portion of the seal member when the cup member is substantially centered over the seal member and moved downward to contact the seal member.

↓

1203

Moving the cup member downward to form the liquid seal between the outer radial portion of the bottom surface of the cup member and the top surface of the inner radial portion of the seal member.

↓

1205

Flowing electroplating solution through the processing region, a portion of the electroplating solution flowing against a bottom surface of the inner radial portion of the seal member and pressing the seal member against the cup member to assist with maintaining the liquid seal between the outer radial portion of the bottom surface of the cup member and the top surface of the inner radial portion of the seal member.

↓

1207

Rotating the cup member relative to both the insert member and the seal member such that the outer radial portion of the bottom surface of the cup member slides on the top surface of the inner radial portion of the seal member while maintaining the liquid seal between the outer radial portion of the bottom surface of the cup member and the top surface of the inner radial portion of the seal member.

Fig. 12

FLOW ASSISTED DYNAMIC SEAL FOR HIGH-CONVECTION, CONTINUOUS-ROTATION PLATING

CLAIM OF PRIORITY

This application claims priority under 35 U.S.C. 119(e) to U.S. Provisional Patent Application No. 62/636,818, filed Feb. 28, 2018, the disclosure of which is incorporated herein by reference in its entirety for all purposes.

BACKGROUND

1. Field of the Disclosure

The present disclosure relates to semiconductor device fabrication.

2. Description of the Related Art

Some semiconductor device fabrication processes include electroplating of a material onto a semiconductor wafer. The electroplating can be done in an electroplating cell in which the wafer, with an electrically conductive seed layer present thereon, is positioned so that the wafer is in physical contact with multiple electrical contacts. The wafer surface on which the seed layer is deposited is exposed to a bath of electroplating solution. An anode containing the metal to be plated onto the wafer is disposed within the bath of the electroplating solution. The anode is electrically connected to a positive terminal of a direct current (DC) power supply. Through the multiple electrical contacts, the wafer is electrically connected to a negative terminal of the DC power supply. The DC power supply is operated to supply DC current to the anode, which oxidizes and dissolves atoms of the anode into the bath of electroplating solution. The wafer functions as the cathode of the electroplating cell, such that negative charge on the wafer reduces the atoms liberated from the anode that are present in the electroplating solution at the surface of the wafer and causes plating of the atoms from the anode onto the wafer. How the wafer is exposed to a flow of the electroplating solution affects how the wafer is exposed to the atoms liberated from the anode within the electroplating solution and thereby affects how the atoms plate onto the wafer. It is within this context that the present disclosure arises.

SUMMARY

In an example embodiment, an apparatus for electroplating a semiconductor wafer is disclosed. The apparatus includes an insert member configured to circumscribe a processing region. The insert member has a top surface. A portion of the top surface of the insert member has an upward slope that slopes upward from a peripheral area of the top surface of the insert member toward the processing region. The apparatus also includes a seal member that has an annular-disk shape. The seal member is positioned on the top surface of the insert member. The seal member is flexible such that an outer radial portion of the seal member conforms to the upward slope of the top surface of the insert member and such that an inner radial portion of the seal member projects inward toward the processing region.

In an example embodiment, a sealing device for an electroplating apparatus for semiconductor wafer fabrication is disclosed. The sealing device includes an annular-disk-shaped structure configured for installation on a top surface of an insert member of the electroplating apparatus. The annular-disk-shaped structure has flexibility to physically conform to a contour of the top surface of the insert member, such that an outer radial portion of the annular-disk-shaped structure conforms to an upward slope of the top surface of the insert member, and such that an inner radial portion of the annular-disk-shaped structure projects inward from the top surface of the insert member, when the annular-disk-shaped structure is installed on the top surface of the insert member.

In an example embodiment, a method is disclosed for electroplating a semiconductor wafer. The method includes having an electroplating apparatus that includes an insert member configured to circumscribe a processing region. The insert member has a top surface. A portion of the top surface of the insert member has an upward slope that slopes upward from a peripheral area of the top surface of the insert member toward the processing region. The electroplating apparatus also includes a seal member having an annular-disk shape. The seal member is positioned on the top surface of the insert member. The seal member is flexible such that an outer radial portion of the seal member conforms to the upward slope of the top surface of the insert member and such that an inner radial portion of the seal member projects toward the processing region. The electroplating apparatus also includes a cup member having an annular shape. The cup member has a bottom surface that includes an outer radial portion configured to form a liquid seal with a top surface of the inner radial portion of the seal member, when the cup member is substantially centered over the seal member and moved downward to contact the seal member. The method also includes moving the cup member downward to form the liquid seal between the outer radial portion of the bottom surface of the cup member and the top surface of the inner radial portion of the seal member. The method also includes flowing electroplating solution through the processing region. A portion of the electroplating solution flows against a bottom surface of the inner radial portion of the seal member and presses the seal member against the cup member to assist with maintaining the liquid seal between the outer radial portion of the bottom surface of the cup member and the top surface of the inner radial portion of the seal member.

In an example embodiment, an insert member for a sealing mechanism within an electroplating apparatus for semiconductor wafer fabrication is disclosed. The insert member includes a structural member configured to circumscribe a processing region within the electroplating apparatus. The structural member has a top surface. A portion of the top surface of the structural member has an upward slope that slopes upward from a peripheral area of the top surface of the structural member toward the processing region. The top surface of the structural member is configured to receive and support a seal member having an annular-disk shape with an inner radial portion of the seal member projecting inward toward the processing region. The structural member has sufficient rigidity to cause an outer radial portion of the seal member to conform to the upward slope of the top surface of the insert member when the inner radial portion of the seal member is pushed downward.

BRIEF DESCRIPTION OF THE DRAWINGS

FIG. 12 shows a flowchart of a method for electroplating a semiconductor wafer, in accordance with some embodiments.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

Figure 1A:
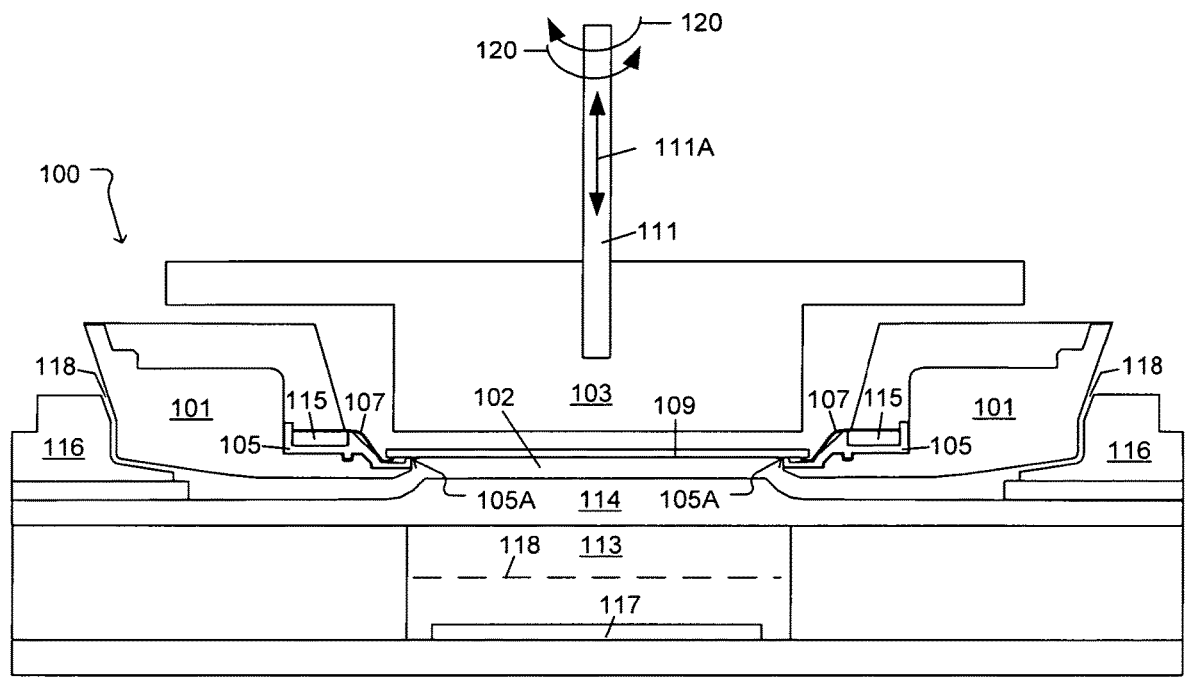
FIG. 1A shows a generalized diagram of a vertical cross-section of an electroplating apparatus for electroplating a wafer, in accordance with some embodiments.

FIG. 1A shows a generalized diagram of a vertical cross-section of an electroplating apparatus 100 for electroplating a wafer 109, in accordance with some embodiments. In an example embodiment, the term wafer as used herein refers to a semiconductor wafer. Also, in various embodiments, the wafer as referred to herein may vary in form, shape, and/or size. For example, in some embodiments, the wafer as referred to herein may correspond to a 200 mm (millimeters) semiconductor wafer, a 300 mm semiconductor wafer, or a 450 mm semiconductor wafer.

The electroplating apparatus 100 includes a cup member 101 and a cone member 103. The electroplating apparatus 100 also includes a lip seal component 105 configured to engage with a top of the cup member 101. A number of finger contacts 107 are disposed on top of the lip seal component 105. The finger contacts 107 are arranged in a circular configuration to provide substantially uniform support to a peripheral edge region of the wafer 109 to be processed.

Figure 2A:
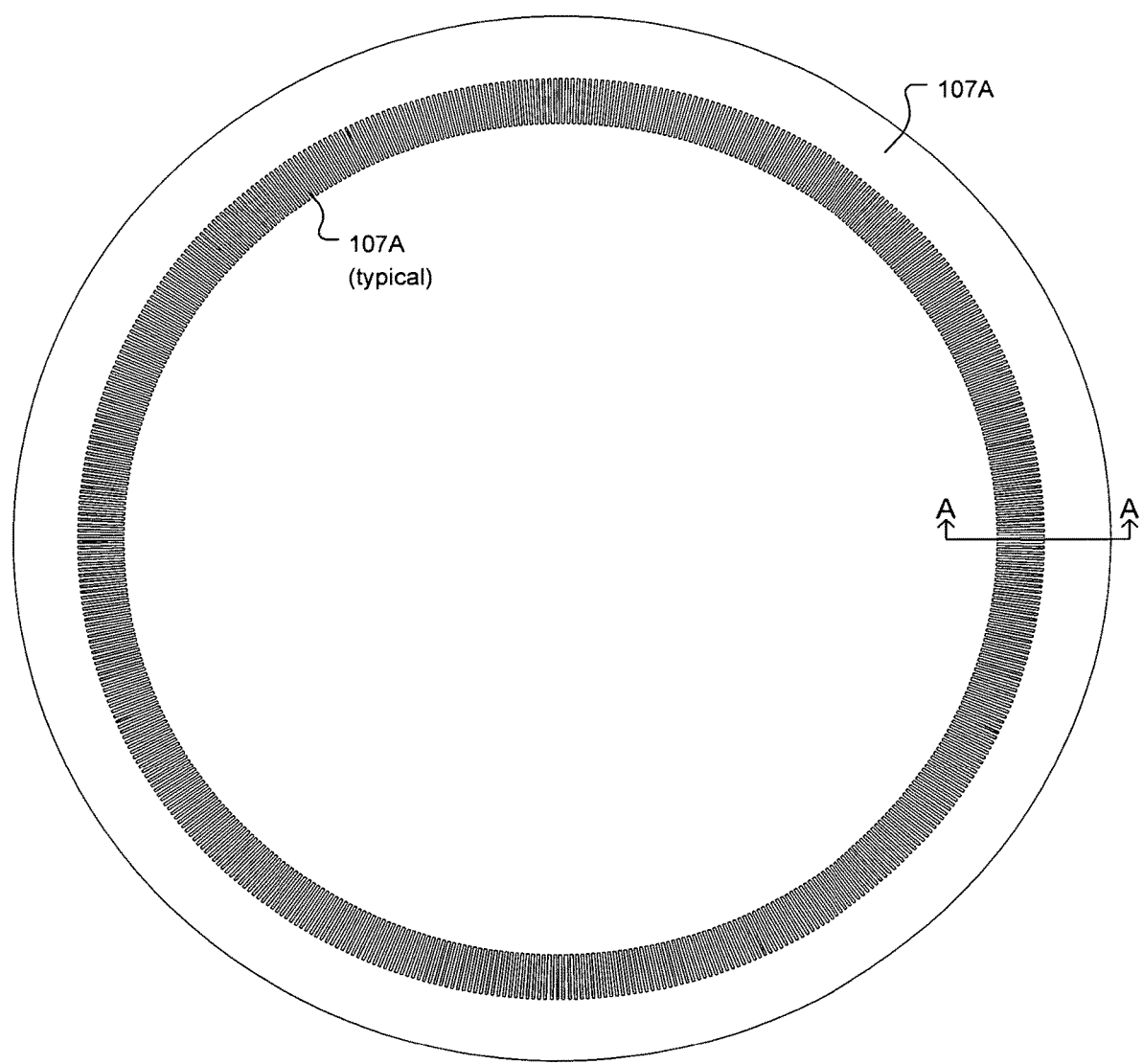
FIG. 2A shows a top view of the finger contacts, in accordance with some embodiments.
Figure 2B:
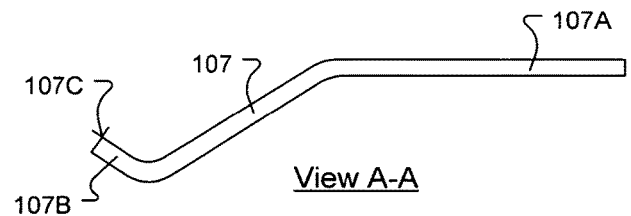
FIG. 2B shows a vertical cross-section view, "View A-A" as referenced in FIG. 2A, through one of the finger contacts, in accordance with some embodiments.

FIG. 2A shows a top view of the finger contacts 107, in accordance with some embodiments. FIG. 2B shows a vertical cross-section view, "View A-A" as referenced in FIG. 2A, through one of the finger contacts 107, in accordance with some embodiments. As shown in FIG. 2A the number of finger contacts 107 are integrally formed in connection with a ring-shaped conductive strip 107A, e.g., metallic strip. Both the finger contacts 107 and the conductive strip 107A are electrically conductive. It should be understood that in various embodiments, the finger contacts 107 and the conductive strip 107A can be formed from any electrically conductive material that provides sufficient electrical conduction for performance of the electroplating process and that has sufficient mechanical properties for supporting the wafer 109 during the electroplating process and that is chemically compatible with the environment and materials to which it is exposed during the electroplating process.

As shown in FIGS. 2B and 1A, the finger contact 107 is shaped so as to bend down following an upper contour of the top of the lip seal member 105. And, an interior end section 107B of the finger contact 107, relative to the circumferential configuration of the conductive strip 107A, is turned upward to provide a support surface 107C for the wafer 109. More specifically, during the electroplating process, the wafer 109 is positioned on the support surfaces 107C of the finger contacts 107, with the surface of the wafer 109 that is to be electroplated facing downward toward a processing region 102 so as to physically contact the support surfaces 107C of the finger contacts 107.

Figure 1B:
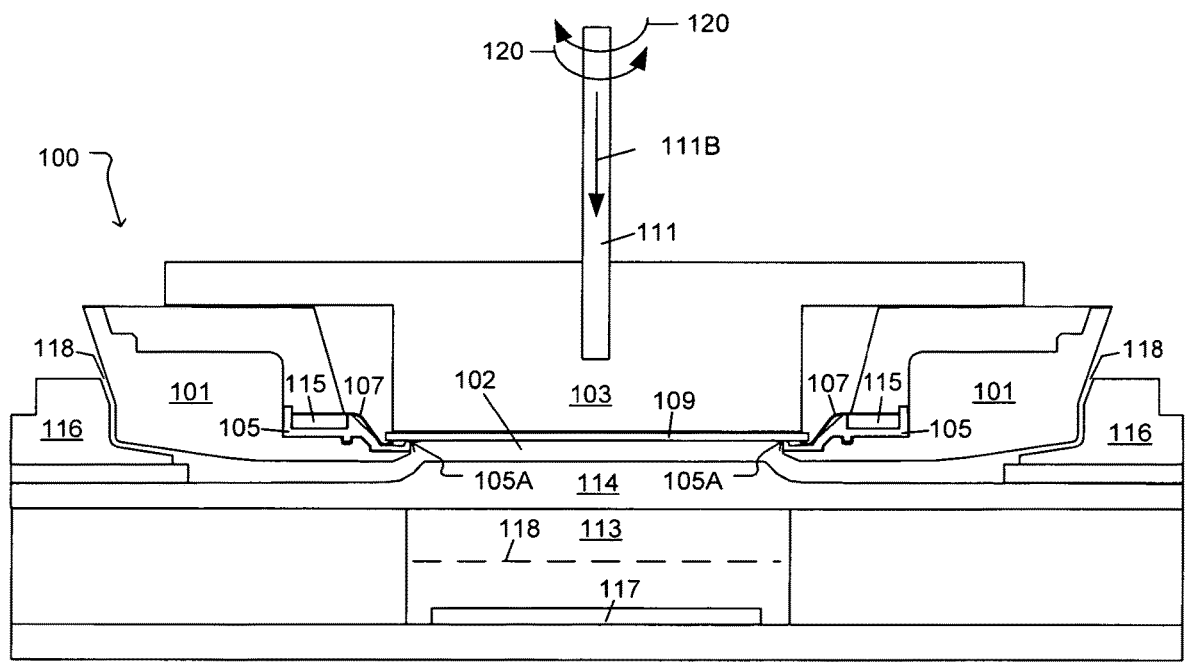
FIG. 1B shows the diagram of FIG. 1A with the cone member moved downward to interface with the wafer, so as press the peripheral downward facing region of the wafer against a sealing surface of the lip seal member, in accordance with some embodiments.

The cone member 103 is attached to a shaft 111 that is configured to move up and down relative to the cup member 101, as indicated by arrow 111A. During the electroplating process, the cone member 103 is moved downward to interface with the wafer 109 and press the wafer 109 onto the support surfaces 107C of the finger contacts 107, so as to flex the interior end sections 107B of the finger contacts 107 downward toward the lip seal member 105, and so as to press the peripheral downward facing region of the wafer 109 against a sealing surface 105A of the lip seal member 105. FIG. 1B shows the diagram of FIG. 1A with the cone member 103 moved downward to interface with the wafer 109, as indicated by arrow 111B, so as press the peripheral downward facing region of the wafer 109 against a sealing surface 105A of the lip seal member 105, in accordance with some embodiments. In the plating position, the cup member 101 is positioned proximate to an insert member 116, such that a gap 119 is present between the cup member 101 and the insert member 116 to allow for rotation of the cup member 101 and wafer 109, as indicated by arrows 120.

A bath volume 113 for containing an electroplating solution is provided below the wafer 109. When the wafer 109 is pressed against the sealing surface 105A of the lip seal member 105 by the downward force exerted by the cone 103, a seal is formed between the wafer 109 and the sealing surface 105A so that electroplating solution will not get past the contact location between the wafer 109 and the sealing surface 105A of the lip seal member 105, thereby keeping electroplating solution away from the finger contacts 107.

The electroplating apparatus 100 also includes a bus bar 115 disposed to physically contact the conductive strip 107A, thereby establishing an electrical connection between the bus bar 115 and the finger contacts 107. The bus bar is formed of a solid piece of metal for improvement in azimuthal electroplating uniformity about a periphery of the wafer 109.

Figure 6:
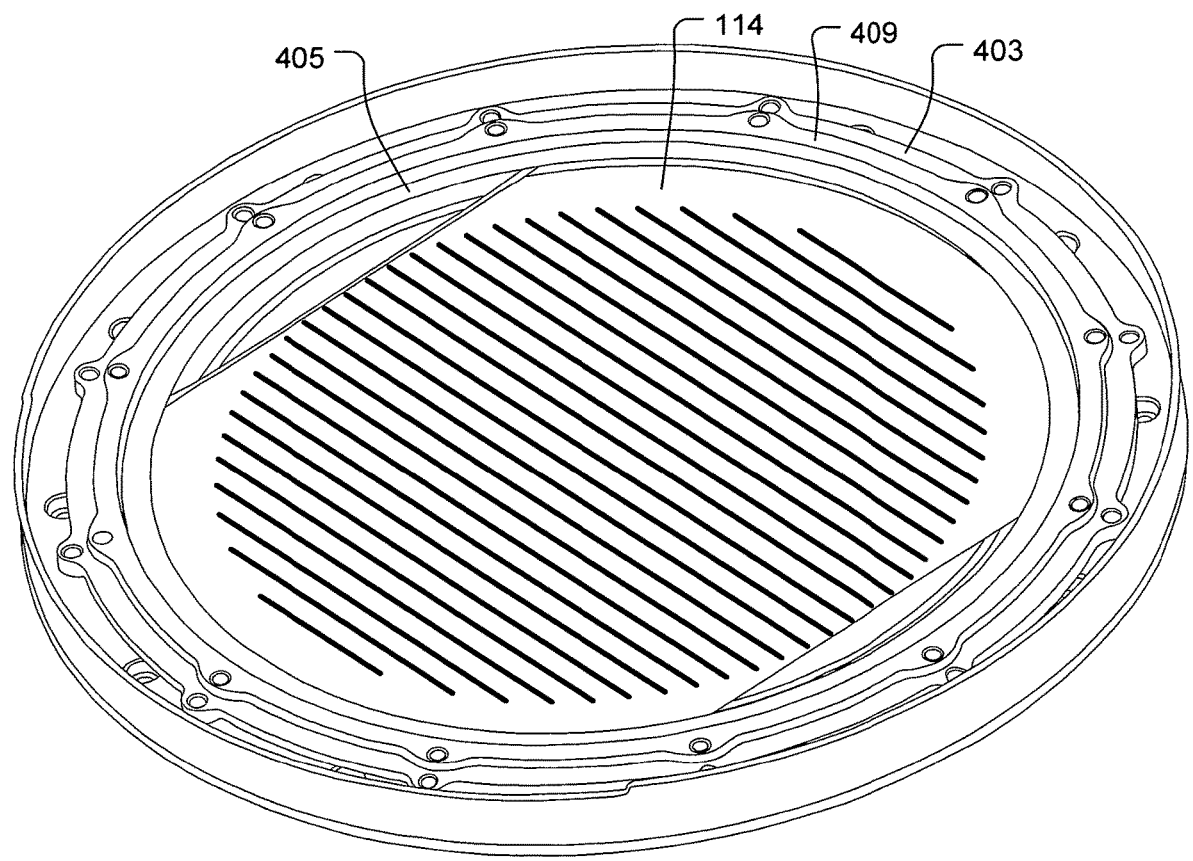
FIG. 6 shows a top isometric view of the insert member, with the seal member and clamp ring installed on the insert member, in accordance with some embodiments.

The bath volume 113 includes an anode member 117. In some embodiments, the anode member 117 is formed of copper. However, in other embodiments, the anode member 117 can be formed of other electrically conductive materials suitable for the particular electroplating process that is being performed. In some embodiments, a membrane 118 is disposed within the bath volume 113 to physically separate an anodic region below the membrane 118 from a cathodic region above the membrane 118. The membrane 118 is configured to prevent bulk communication of electroplating solution (electrolyte) between the anodic region and the cathodic region, while allowing for ionic communication between the anodic region and the cathodic region. In some embodiments, the membrane 118 is an ion selective membrane. A channeled ionic resistive plate (CIRP) 114 is positioned between the wafer 109 and the anode member 117. The CIRP 114 includes channels to allow electroplating solution from the bath volume 113 to flow upward into the processing region 102 and to the surface of the wafer 109. These channels within the CIRP 114 are shown in FIG. 6.

During the electroplating process, a positive terminal of a direct current power supply is electrically connected to the anode member 117, and a negative terminal of the direct current power supply is electrically connected to the bus bar 115. In this manner an electrical current flow path is established from the anode member 117 through the electroplating solution to the surface of the wafer 109 exposed to the electroplating solution, and from the surface of the wafer 109 to the finger contacts 107, and from the finger contacts 107 to the bus bar 115. Typically, prior to the electroplating process, a conductive seed layer is formed on the surface of the wafer 109 to be plated, thereby providing initial electrical conductivity across the wafer 109. Then, as material deposits/grows on the wafer 109 during the electroplating process, the deposited material contributes to the electrical conductivity across the wafer 109.

Figure 3:
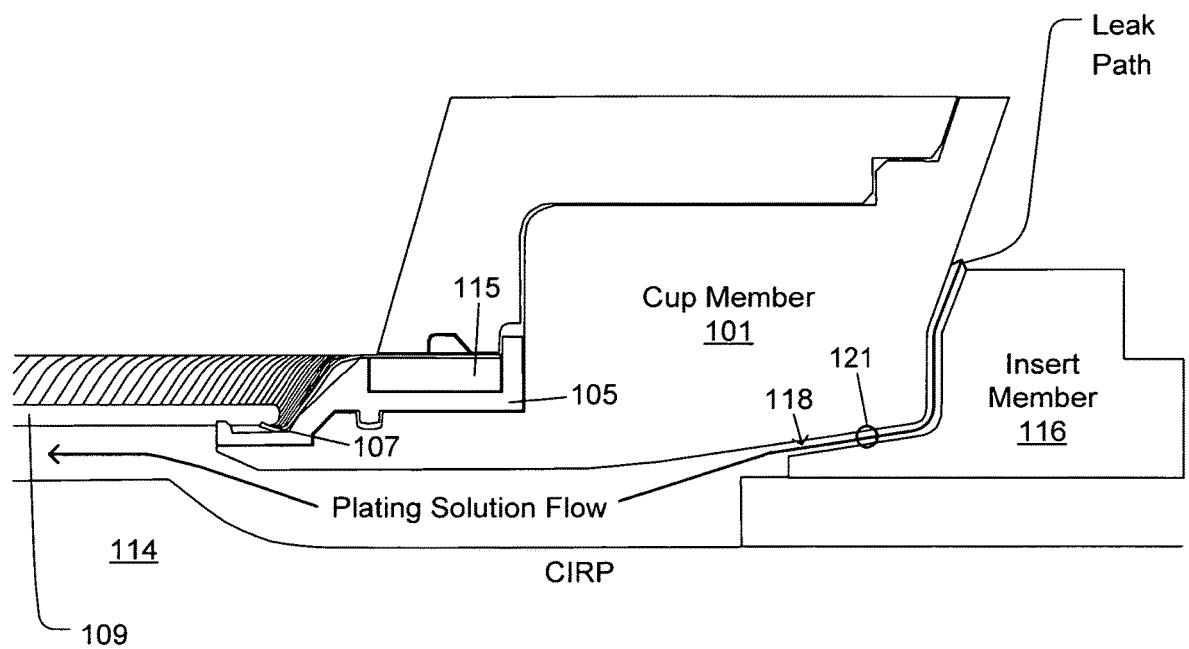
FIG. 3 shows a vertical cross-section of the cup member positioned near the insert member, in accordance with some embodiments.

FIG. 3 shows a vertical cross-section of the cup member 101 positioned near the insert member 116. The cup member 101 (holding the wafer 109 face-down) is placed in close proximity though slightly above the top side of the insert member 116 to allow rotation of the cup member 101 and wafer 109 during plating. In the configuration of FIG. 3, the gap 119 between the cup member 101 and the insert member 116 is unsealed. Electroplating solution (provided from under/within the CIRP 114) is provided as a high velocity cross-flow between the CIRP 114 and wafer 109, with the goal of providing fresh supply of electroplating solution deep into the wafer's features. Because of the large pressure generated by the cross-flow of electroplating solution, a portion of the flow leaks out of the gap 119 between the cup member 101 and insert member 116. This loss of electroplating solution reduces the quantity and velocity of the cross-flow of electroplating solution that contacts the wafer 109 surface. Fluidic models have indicated that up to 30% of the cross-flow of electroplating solution can be lost through the gap 119 between the cup member 101 and the insert member 116. This loss of electroplating solution reduces metal ion supply deep within through-resist features, thereby reducing the plating throughput while also degrading on-wafer performance. However, in the configuration of FIG. 3, the gap 119 between the cup member 101 and the insert member 116 is maintained to enable rotation of the cup member 101 (and wafer 109) relative to the insert member 116.

A modified version of the configuration of FIG. 3 can include a rubber seal 121 (e.g., Viton rubber seal) disposed between the cup member 101 and the insert member 116 to reduce the cross-flow leakage of electroplating solution through the gap 119. In various embodiments, the rubber seal 121 can be attached either to the cup member 101 or to the top side of the insert member 116. When the rubber seal 121 is compressed tightly between the cup member 101 and the insert member 116, cross-flow electroplating solution is stopped from leaking out through the gap 119 around the cup member 101. However, the rubber seal 121 approach can have some limitations. For example, the rubber seal 121 may only be effective at stopping electroplating solution flow leakage when the rubber seal 121 is firmly compressed between the cup member 101 and the insert member 116. In this firmly compressed state, the cup member 101 (and wafer 109) cannot be rotated relative to the insert member 116 in a continuous manner while plating without damaging the cup member 101 and/or rubber seal 121. Because plating without rotation of the wafer 109 can result in large feature tilt (poor within-feature (WiF) uniformity control) and can also lead to poor co-planarity/within-die (WiD) uniformity control (depending on the wafer 109 layout), rotation of the wafer 109 can be necessary to achieve acceptable plating performance. Also, the rubber seal 121 between the cup member 101 and the insert member 116 is a soft material that can have a short operational lifetime under high friction conditions. Additionally, the rubber seal 121 between the cup member 101 and the insert member 116 can be highly susceptible to failure from rubber seal 121 aging/wear or improper setup. For example, as the rubber seal 121 becomes stretched, soft, and/or damaged with age/wear, the rubber seal 121 may no longer resist flow/pressure of the electroplating solution even when compressed to a proper plating gap. The plating gap is the distance between the cup member 101 and the insert member 116. Also, if the plating gap is set too high, the rubber seal 121 may not make firm contact with both the cup member 101 and the insert member 116 due to the rubber seal 121 having an inherently small effective range of seal.

Figure 4:
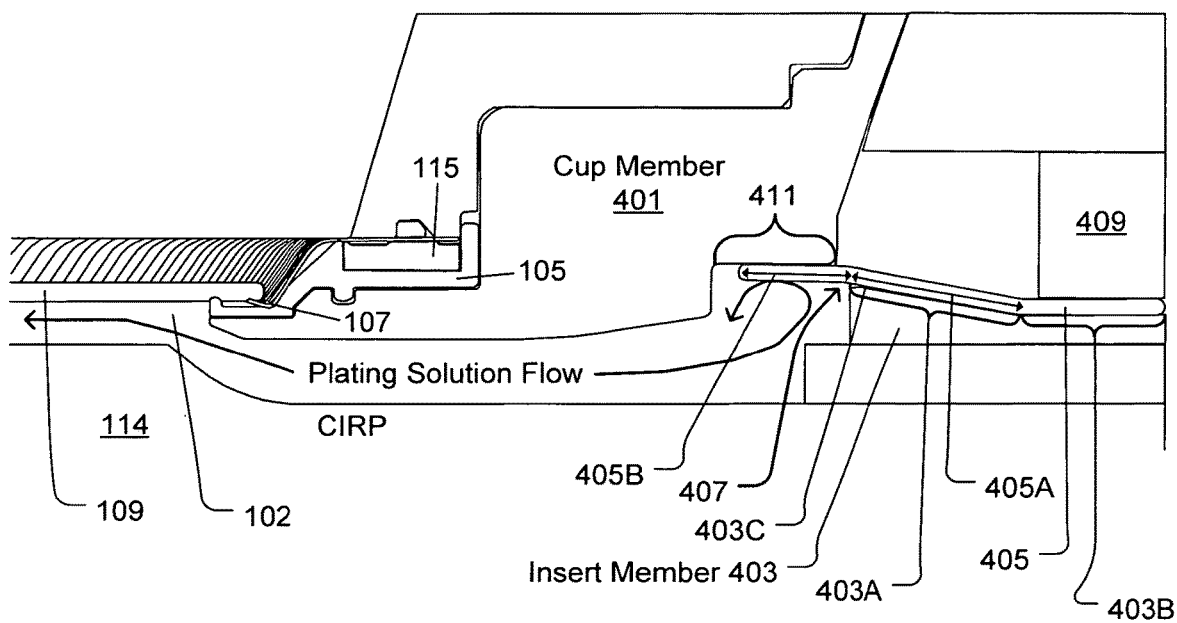
FIG. 4 shows a vertical cross-section of a cup member positioned near an insert member, with a flow-assisted dynamic seal disposed to seal a gap between the cup member and the insert member, in accordance with some embodiments.

FIG. 4 shows a vertical cross-section of a cup member 401 (modified relative to cup member 101) positioned near an insert member 403 (modified relative to insert member 116) with a flow-assisted dynamic seal 405 disposed to seal a gap 407 between the cup member 401 and the insert member 403, in accordance with some embodiments. The flow-assisted dynamic seal 405 is referred to hereafter as a seal member 405. The seal member 405 is a robust seal that eliminates cross-flow leakage of electroplating solution through the gap 407 between the cup member 401 and the insert member 403, so as to maximize convection of electroplating solution at the wafer 109 surface to enable high throughput plating and uniform deposition.

In some embodiments, the seal member 405 has an annular-disk shape. In these embodiments, when viewed from above or below, the seal member 405 has a substantially annular shape defined by a uniform inner diameter and by an outer periphery. In some embodiments, the outer periphery of the seal member 405 can vary in shape as a function of azimuthal position around the outer periphery of the seal member 405. For example, in some embodiments, the outer periphery of the seal member 405 can include a number of spaced apart outward radial projections in which holes are formed through the seal member 405 for fastener insertion.

The seal member 405 is positioned on the top surface of the insert member 403. The insert member 403 is configured to circumscribe the processing region 102. A portion 403A of the top surface of the insert member 403 has an upward slope that slopes upward from a peripheral area 403B of the top surface of the insert member 403 toward the processing region 102, and to an apex 403C of the top surface of the insert member 403. The seal member 405 is flexible such that an outer radial portion 405A of the seal member 405 conforms to the upward slope of the portion 403A of the top surface of the insert member 405, and such that an inner radial portion 405B of the seal member 405 projects inward toward the processing region 102.

In some embodiments, the inner radial portion 405B of the seal member 405 projects toward the processing region 102 at an upward angle relative to horizontal when the seal member 405 is positioned on the top surface of the insert member 403. In some embodiments, the inner radial portion 405B of the seal member 405 projects inward toward the processing region 102 from the apex 403C of the top surface of the insert member 405. And, the inner radial portion 405B of the seal member 405 is configured to flex downward about the apex 403C of the top surface of the insert member 403 when a downward force is applied to a top surface of the inner radial portion 405B of the seal member 405.

The leakage path that the seal member 405 stops is the small but significant gap 407 between the cup member 401 (which holds the wafer 109 facing downward toward the processing region 102) and a top side of the insert member 403. The insert member 403 is attached to the CIRP 114 that separates the wafer 109 from the anode 117. The seal member 405 is attached to the top side of the insert member 403 (as opposed to being attached to the cup member 401) using a clamp ring 409. The top side of the insert member 403 is formed to slant upward toward the processing region 102, which forces the seal member 405 to arc upward when the seal member 405 is clamped down to the top side of the insert member 403 by the clamp ring 409. In some embodiments, the clamp ring 409 is configured to hold the seal member 405 against the top surface of the insert member 403 at a location radially outside of the upward slope of the top surface of the insert member 403. For example, in the example configuration of FIG. 4, the clamp ring 409 is configured to hold the seal member 405 against the top surface of the insert member 403 at the peripheral area 403B located radially outside of the upward slope of the portion 403A of the top surface of the insert member 403. In some embodiments, the clamp ring 409 is bolted to the insert member 403 through the seal member 405. However, it should be understood that in other embodiments, the clamp ring 409 can be secured to the insert member 403 in other ways, such as by exterior c-clamps or other tightening/fastening devices, so long as the clamp ring 409 functions to pull the seal member 405 downward toward the top surface of the insert member 403 such that the seal member 405 assumes a vertical cross-sectional shape that conforms to the contour of the top surface of the insert member 403.

The cup member 401 has an annular shape so as to circumscribe the processing region 102. The cup member 401 has a bottom surface that includes an outer radial portion 411 configured to form a liquid seal with the top surface of the inner radial portion 405B of the seal member 405 when the cup member 401 is substantially centered over the seal member 405 and moved downward to contact the seal member 405. In some embodiments, the outer radial portion 411 of the bottom surface of the cup member 401 is part of a notch region formed at the bottom perimeter of the cup member 401 to provide a location where the seal member 405 can press against the cup member 401 in a substantially uniform manner about the periphery of the cup member 101 to firmly block electroplating solution leak paths through the gap 407. In some embodiments, the outer radial portion 411 of the bottom surface of the cup member 401 has a substantially horizontal orientation when the cup member 401 is substantially centered over the seal member 405 and moved downward to contact the seal member 405. It should be understood that the top surface of the inner radial portion 405B of the seal member 405 presses firmly against outer radial portion 411 of the bottom surface of the cup member 401, when the cup member 401 is lowered into plating position, i.e., when the cup member 401 is lowered relative to the insert member 403 to a position at which the inner radial portion 405B of the seal member 405 is contacted and pressed downward by the outer radial portion 411 of the bottom surface of the cup member 401.

The slanted design of the top side of the insert member 403 serves to pre-load the seal member 405, such that the inner radial portion 405B of the seal member 405 arcs upward to make contact with the cup member 401 when the cup member 401 is lowered into plating position. In some embodiments, the cup member 401 is configured to rotate relative to the seal member 405 when the cup member 401 is substantially centered over the seal member 405 and moved downward to contact the seal member 405, such that the outer radial portion 411 of the bottom surface of the cup member 401 is configured to slide on the top surface of the inner radial portion 405B of the seal member 405 while maintaining the liquid seal with the top surface of the inner radial portion 405B of the seal member 405.

The seal member 405 is made of a durable and low-friction/slippery material to enable rotation of the cup member 401 relative to the seal member 405. The cup member 401 can be continuously rotated while in contact with the seal member 405 to provide for continuous rotation of the wafer 109 (i.e., in a dynamic fashion) without damaging the seal member 405 and/or the cup member 401, even at cup member 401/wafer 109 rotation rates up to 200 rpm (revolutions per minute). In some embodiments, the seal member 405 is formed of polytetrafluoroethylene (PTFE). For example, in some embodiments, the seal member 405 is made of TEFLON™, which is a form of PTFE. When the seal member 405 is formed of PTFE, the top surface of the inner radial portion 405B of the seal member 405 is durable and has a low coefficient of friction so that the cup member 401 can rotate against the seal member 405 without damaging either the cup member 401 or the seal member 405. In some embodiments, the seal member 405 is formed of a material other than PTFE. For example, in some embodiments, the seal member 405 is formed of a low friction, high wear resistance polymer, such as polyphenylene sulfide (PPS), polyether ether ketone (PEEK), polyamideimide (PAI), or ultra-high-molecular-weight polyethylene (UHMW), among others.

In some embodiments, the seal member 405 can be formed of an elastomer mixture, so long as the seal member 405 has sufficient durability and a sufficiently low coefficient of friction to enable rotation of the cup member 401 against the seal member 405 without damaging either the cup member 401 or the seal member 405. In some embodiments, the seal member 405 can be formed of an elastomer mixture that includes a low friction additive that reduces the coefficient of friction of the seal member 405. For example, in some embodiments, the low friction additive is one or more of polytetrafluoroethylene, molybdenum disulfide, and graphite. In some embodiments, the seal member 405 has a coefficient of friction less than about 0.5. In some embodiments, the seal member has a coefficient of friction less than about 0.1.

The seal member 405 is referred to as a "flow-assisted dynamic seal" because a pressure of the electroplating solution flow underneath the cup member 401 is used to enhance the sealing ability of the seal member 405 by pressing the inner radial portion 405B of the seal member 405 more firmly against the cup member 401. It should be appreciated that in contrast to the above-mentioned rubber seal 121 disposed between the cup member 101 and the insert member 116, which can leak when the electroplating solution flow pushes against the rubber seal 121, the configuration of the seal member 405 uses the pressure of the electroplating solution flow underneath the cup member 401 to enhance the sealing ability of the seal member 405 by pressing the inner radial portion 405B of the seal member 405 more firmly against the outer radial portion 411 of the bottom surface of the cup member 401. Additionally, another advantage of the seal member 405 relative to the rubber seal 121 is that that the seal member 405 conforms to misalignments between the cup member 401 and the insert member 116. In contrast to the seal member 405, the rubber seal 121 has low compression and imperfect parallelism between the cup member 401 and the insert member 116, which results in varying compression and corresponding sealing performance along the sealing interface provided by the rubber seal 121. Relative to the rubber seal 121, the seal member 405 provides much higher compression without application of significantly higher force. This means that the performance of the seal member 405 is maintained over a larger range of operating conditions.

Use of the seal member 405 provides for optimal plating conditions by enabling: 1) high electroplating solution cross-flow across the wafer 109 due to minimized electroplating solution flow leaks, and 2) continuous rotation of the cup member 401/wafer 109. These optimal plating conditions of minimized electroplating solution flow leakage and continuous cup member 401/wafer 109 rotation, together yield high wafer 109 processing throughput and excellent WiF and WiD. Also, the seal member 405 is flexible and effective over a wide setup range. That is, the seal member 405 has a large effective range. More specifically, the seal member 405 is able to eliminate electroplating solution flow losses through the gap 407, even if the plating gap (distance between the cup member 401 and the insert member 403) is varied over several millimeters. The large effective range of the seal member 405 is achieved through the flexibility and the pre-loaded, upward-arcing design of the seal member 405. The large effective range of the seal member 405 enables a high process-window and high margin-for-error in terms of hardware installation and setup reproducibility. The large effective range of the seal member 405 also enables edge tuning the wafer 109 performance (e.g., feature height distribution) by intentionally varying the plating gap. Also, the plating gap adjustability afforded by the seal member 405, while maintaining the sealed state between the cup member 401 and the insert member 403, enables processing of multiple product types. Even under various loads and/or plating gap setup heights, the seal member 405 is able to effectively block electroplating solution flow losses through the gap 407 over a wide range due to its flexibility and pre-loaded, upward arcing design.

Figure 5A:
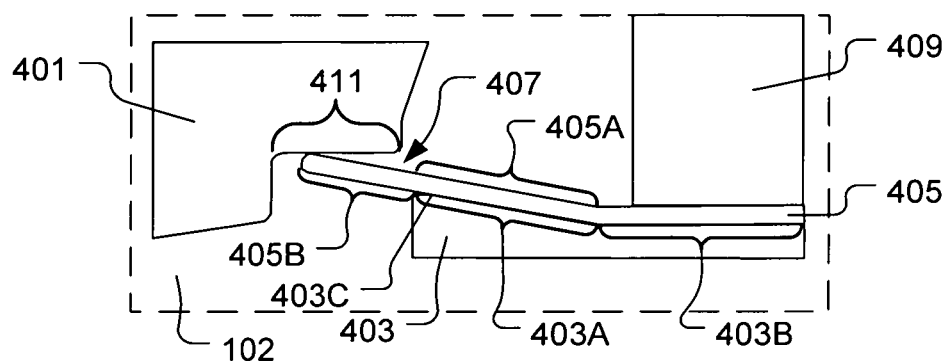
FIG. 5A shows a vertical cross-section of the interface between the cup member and the seal member just as the outer radial portion of the bottom surface of the cup member is brought into contact with the inner radial portion of the seal member, in accordance with some embodiments.
Figure 5B:
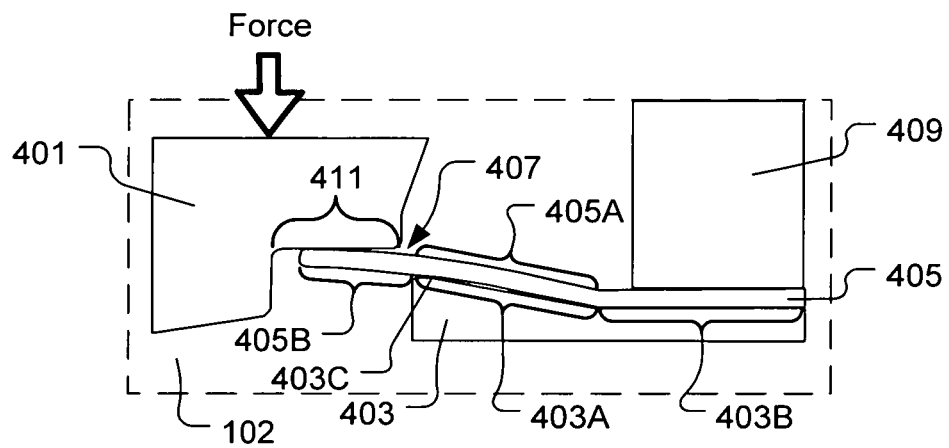
FIG. 5B shows the vertical cross-section of the interface between the cup member and the seal member of FIG. 5A as the cup member is lowered further relative to the insert member, in accordance with some embodiments.
Figure 5C:
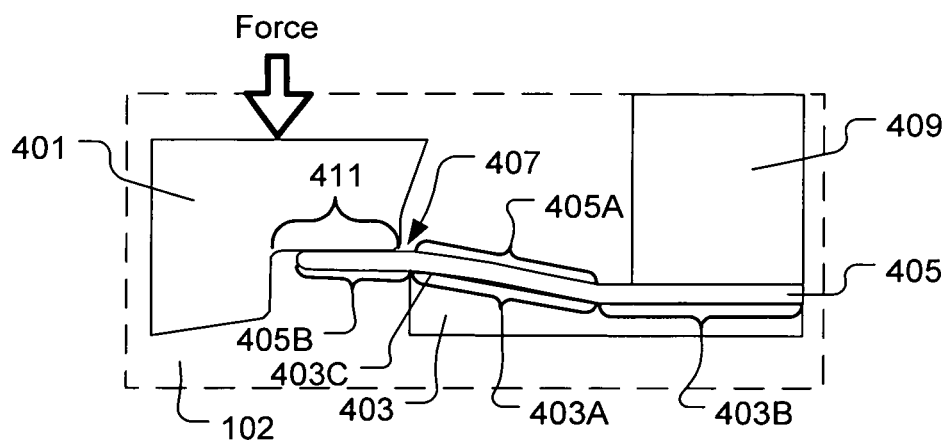
FIG. 5C shows the vertical cross-section of the interface between the cup member and the seal member of FIG. 5B as the cup member is lowered further relative to the insert member to a plating position, in accordance with some embodiments.

FIG. 5A shows a vertical cross-section of the interface between the cup member 401 and the seal member 405 just as the outer radial portion 411 of the bottom surface of the cup member 401 is brought into contact with the inner radial portion 405B of the seal member 405, in accordance with some embodiments. The contact between the cup member 401 and the seal member 405 in FIG. 5A may be sufficient to seal the gap 407 between the cup member 401 and the insert member 403. FIG. 5B shows the vertical cross-section of the interface between the cup member 401 and the seal member 405 of FIG. 5A as the cup member 401 is lowered further relative to the insert member 403, in accordance with some embodiments. As the seal member 405 presses against the outer radial portion 411 of the bottom surface of the cup member 401, the seal member 405 can flex to ensure a tight seal against the cup member 401. In the configuration of FIG. 5B, the cup member 401 makes moderate contact with the seal member 405. FIG. 5C shows the vertical cross-section of the interface between the cup member 401 and the seal member 405 of FIG. 5B as the cup member 401 is lowered further relative to the insert member 403 to a plating position, in accordance with some embodiments. At the plating position, the seal member 405 presses against the outer radial portion 411 of the bottom surface of the cup member 401, and the seal member 405 flexes to contact an area within the outer radial portion 411 of the bottom surface of the cup member 401 to ensure a substantially liquid-tight seal against the cup member 401. In the configuration of FIG. 5C, the cup member 401 makes extensive contact with the seal member 405.

Figure 7:
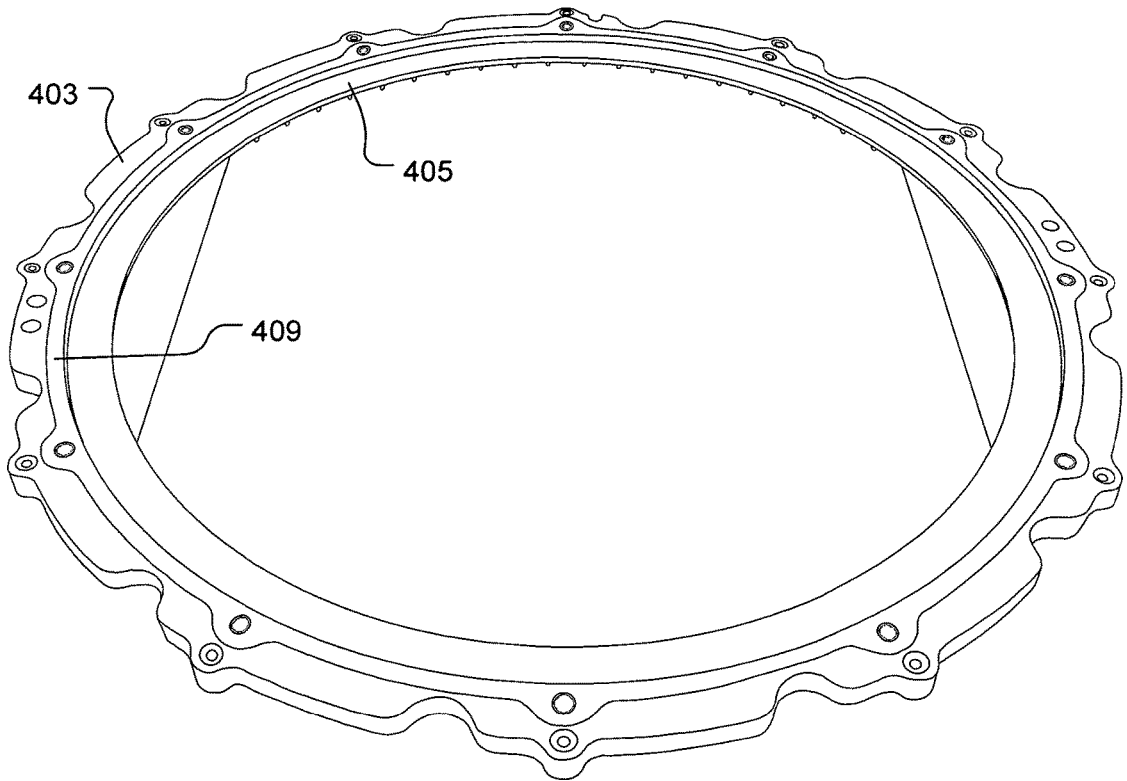
FIG. 7 shows another top isometric view of the insert member, with the seal member and clamp ring installed on the insert member, in accordance with some embodiments.

FIG. 6 shows a top isometric view of the insert member 403 with the seal member 405 and clamp ring 409 installed on the insert member 403, in accordance with some embodiments. FIG. 7 shows another top isometric view of the insert member 403 with the seal member 405 and clamp ring 409 installed on the insert member 403, in accordance with some embodiments.

Figure 8:
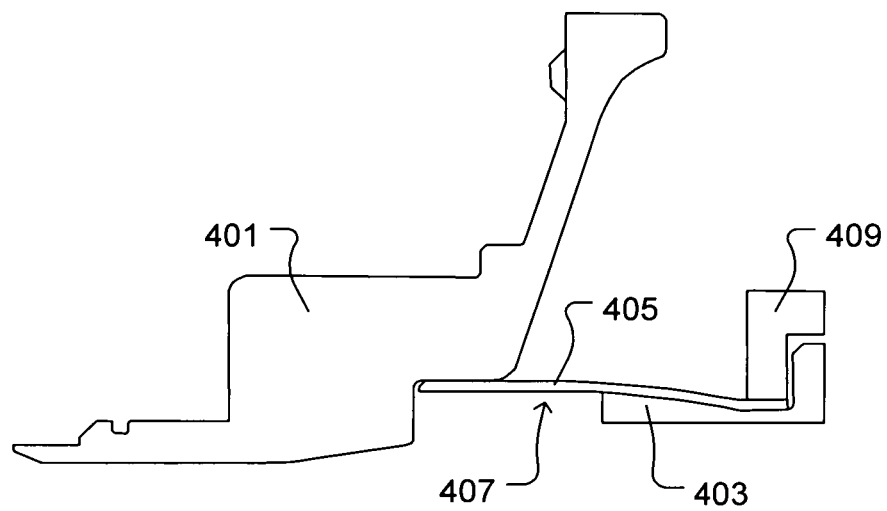
FIG. 8 shows a vertical cross-section view of the seal member positioned to seal/close the gap between the cup member and the insert member when the cup member is lowered to the plating position, in accordance with some embodiments.
Figure 9:
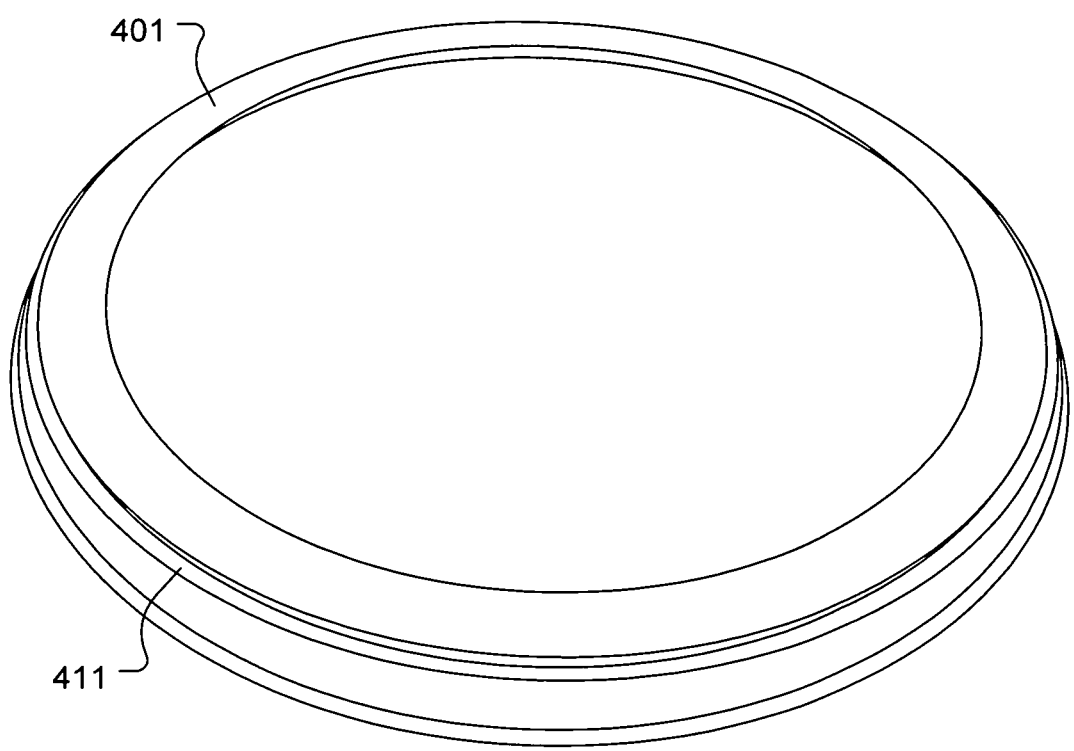
FIG. 9 shows a bottom isometric view of the cup member, in accordance with some embodiments.

FIG. 8 shows a vertical cross-section view of the seal member 405 positioned to seal/close the gap 407 between the cup member 401 and the insert member 403 when the cup member 401 is lowered to the plating position, in accordance with some embodiments. FIG. 9 shows a bottom isometric view of the cup member 401, in accordance with some embodiments. The outer radial portion 411 of the bottom surface of the cup member 401 is shown in FIG. 9.

Figure 10A:
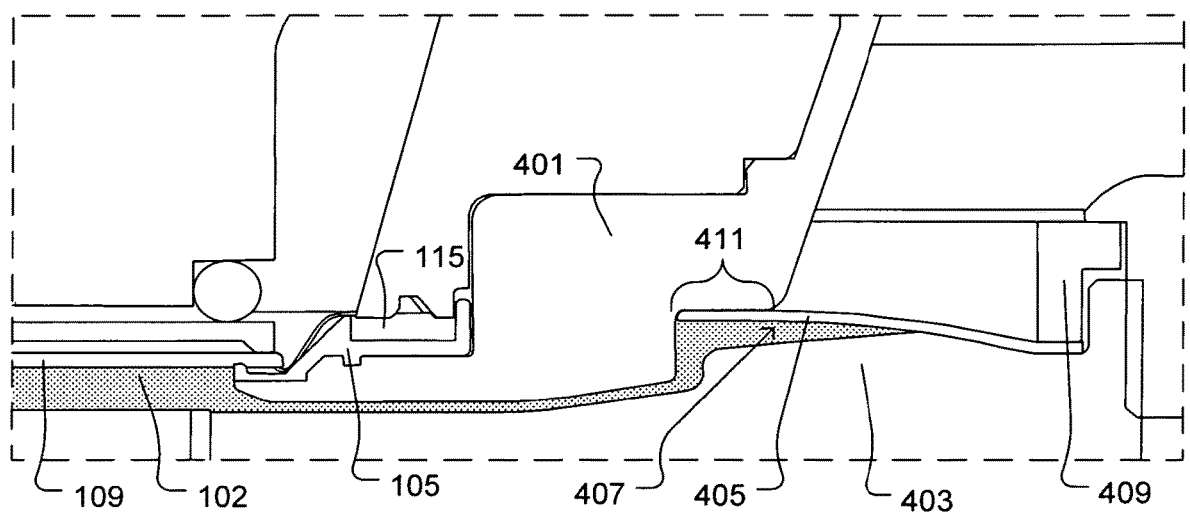
FIG. 10A shows another vertical cross-section view of the seal member positioned to seal/close the gap between the cup member and the insert member when the cup member is lowered to the plating position, in accordance with some embodiments.
Figure 10B:
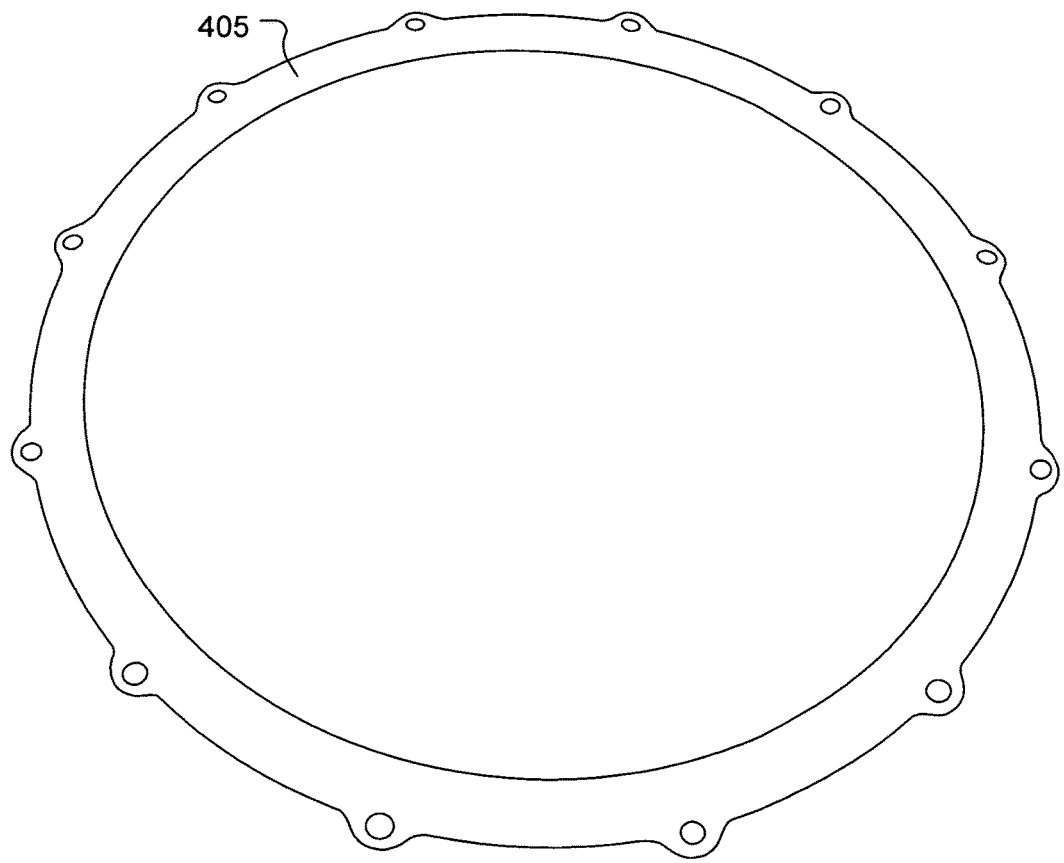
FIG. 10B shows a top isometric view of the seal member, in accordance with some embodiments.

FIG. 10A shows another vertical cross-section view of the seal member 405 positioned to seal/close the gap 407 between the cup member 401 and the insert member 403 when the cup member 401 is lowered to the plating position, in accordance with some embodiments. FIG. 10B shows a top isometric view of the seal member 405, in accordance with some embodiments.

Figure 11A:
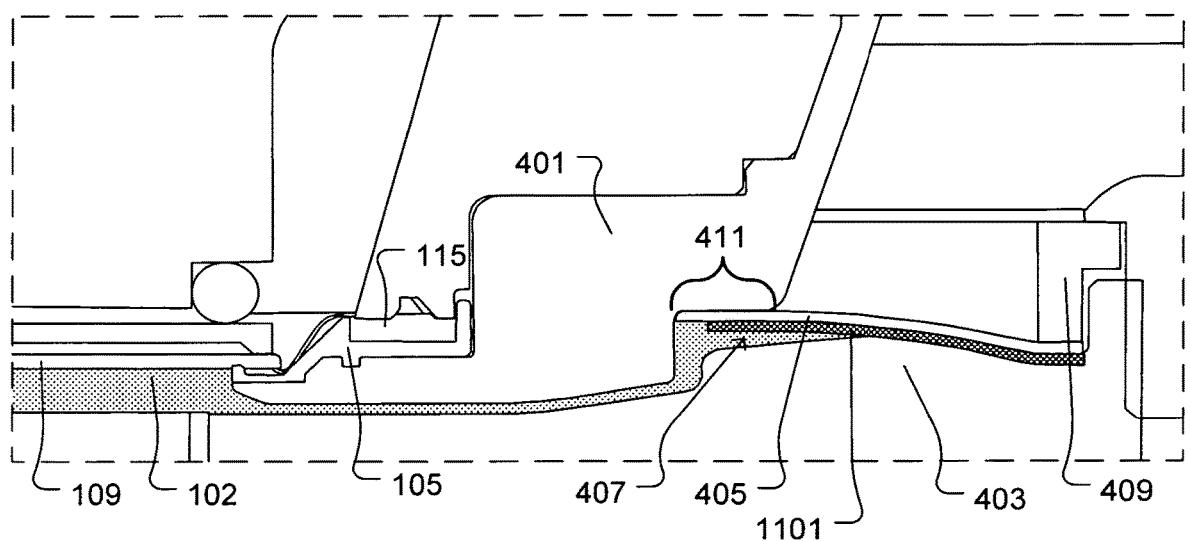
FIG. 11A shows a vertical cross-section of the cup member positioned near the insert member, with the seal member disposed to seal the gap between the cup member and the insert member, and with a backing member positioned below the seal member, in accordance with some embodiments.
Figure 11B:
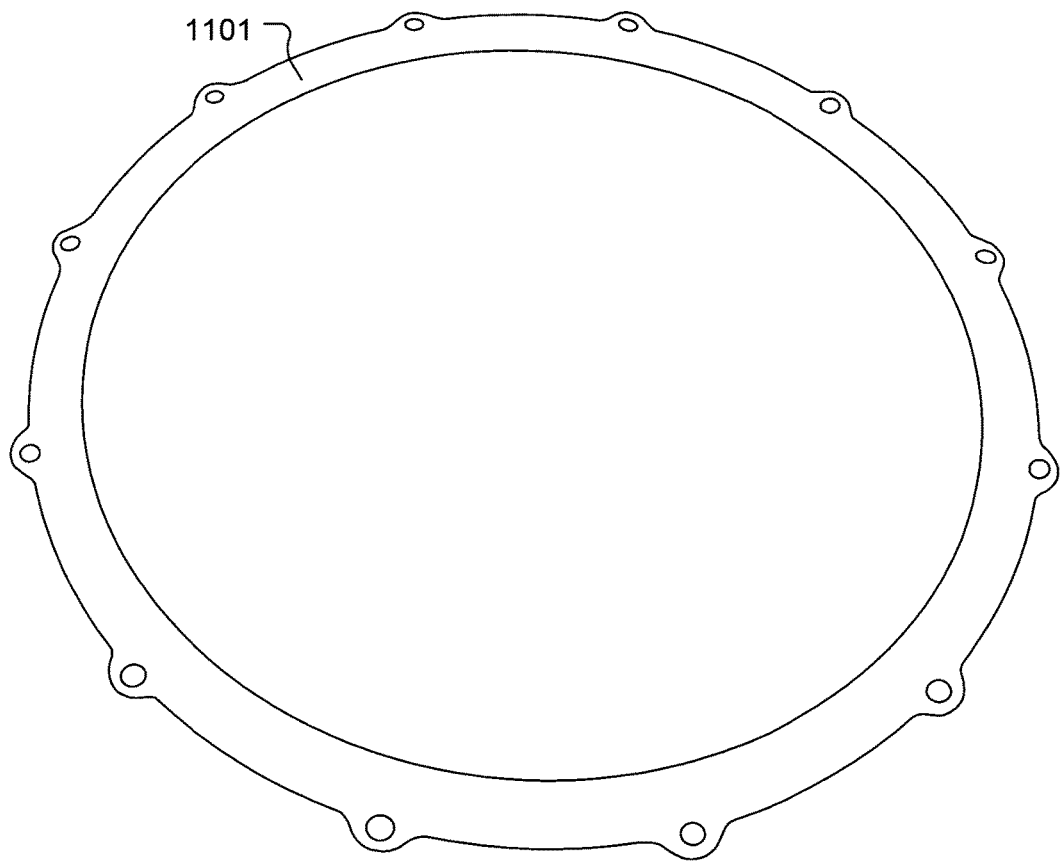
FIG. 11B shows a top isometric view of the backing member, in accordance with some embodiments.

FIG. 11A shows a vertical cross-section of the cup member 401 positioned near the insert member 403 with the seal member 405 disposed to seal the gap 407 between the cup member 401 and the insert member 403, and with a backing member 1101 positioned below the seal member 405, in accordance with some embodiments. The backing member 1101 can also be referred to as an "energizer." FIG. 11B shows a top isometric view of the backing member 1101, in accordance with some embodiments. The backing member 1101 is disposed between the seal member 405 and the top surface of the insert member 403. More specifically, the backing member 1101 is positioned between the seal member 405 and the top side of the insert member 403, and is clamped to the insert member 403 in conjunction with clamping of the seal member 405 to the insert member 403 using the clamp ring 409. In some embodiments, the backing member 1101 has a shape that is substantially equivalent to the annular-disk shape of the seal member 405. In some embodiments, the clamp ring 409 is configured to hold both the seal member 405 and the backing member 1101 against the top surface of the insert member 403 at a location radially outside of the upward slope of the top surface of the insert member 403. In some embodiments, the clamp ring 409 is bolted to the top surface of the insert member 403 through both the seal member 405 and the backing member 1101.

The backing member 1101 is a support material disposed as a backing underneath the seal member 405 to increase a pressure applied by the seal member 405 against the cup member 401 and to extend the operational lifetime of the seal member 405. The backing member 1101 is configured to apply a resistive upward force through the seal member 405 when a downward force is applied to a top surface of the inner radial portion 405B of the seal member 405. Also, the backing member 1101 is configured to prevent a flow of electroplating solution against a bottom surface of the inner radial portion 405B of the seal member 405. In some embodiments, the backing member 1101 is formed of spring stainless steel. However, in other embodiments, the backing member 1101 can be formed of other materials that provide adequate mechanical, chemical, and thermal performance. The backing member 1101 can extend the operational lifetime of the seal member 405 by reducing the susceptibility of the seal member 405 to creasing. The backing member 1101 can also serve as a scaffolding for the seal member 405 in the event that the seal member 405 gradually creeps or deforms over time. When the backing member 1101 is formed of spring stainless steel, or similar material, the backing member 1101 can be thermally treated to retain its integrity and resist deformation.

It should be understood a sealing device is disclosed herein for an electroplating apparatus for semiconductor wafer fabrication. The sealing device includes the seal member 405 defined as an annular-disk-shaped structure configured for installation on the top surface of the insert member 403 of the electroplating apparatus. The annular-disk-shaped structure (seal member 405) has flexibility to physically conform to the contour of the top surface of the insert member 403 such that the outer radial portion 405A of the annular-disk-shaped structure (seal member 405) conforms to the upward slope of the top surface of the insert member 403, and such that the inner radial portion 405B of the annular-disk-shaped structure (seal member 405) projects inward toward the processing region when the annular-disk-shaped structure (seal member 405) is installed on the top surface of the insert member 403.

FIG. 12 shows a flowchart of a method for electroplating a semiconductor wafer, in accordance with some embodiments. The method includes an operation 1201 for having an electroplating apparatus that includes the insert member 403 configured to circumscribe the processing region 102. The top surface of the insert member 403 includes the portion 403A has the upward slope that slopes upward from the peripheral area 403B of the top surface of the insert member 403 toward the processing region 102. The electroplating apparatus also includes the seal member 405 having the annular-disk shape. The seal member 405 is positioned on the top surface of the insert member 403. The seal member 405 is flexible such that the outer radial portion 405A of the seal member 405 conforms to the upward slope of the top surface of the insert member 403, and such that the inner radial portion 405B of the seal member 405 projects toward the processing region 102. The electroplating apparatus also includes the cup member 401 having an annular shape. The cup member 401 has the bottom surface that includes the outer radial portion 411 configured to form the liquid seal with the top surface of the inner radial portion 405B of the seal member 405 when the cup member 401 is substantially centered over the seal member 405 and moved downward to contact the seal member 405.

The method also includes an operation 1203 for moving the cup member 401 downward to form the liquid seal between the outer radial portion 411 of the bottom surface of the cup member 401 and the top surface of the inner radial portion 405B of the seal member 405. The method also includes an operation 1205 for flowing electroplating solution through the processing region 102. In the operation 1205, a portion of the electroplating solution flows against the bottom surface of the inner radial portion 405B of the seal member 405 and presses the seal member 405 against the cup member 401 to assist with maintaining the liquid seal between the outer radial portion 411 of the bottom surface of the cup member 401 and the top surface of the inner radial portion 405B of the seal member 405. The method also includes an optional operation 1207 for rotating the cup member 401 relative to both the insert member 403 and the seal member 405, such that the outer radial portion 411 of the bottom surface of the cup member 401 slides on the top surface of the inner radial portion 405B of the seal member 405 while maintaining the liquid seal between the outer radial portion 411 of the bottom surface of the cup member 401 and the top surface of the inner radial portion 405B of the seal member 405.

It should be appreciated that the seal member 405 disclosed herein, along with the cup member 401 and the insert member 403, reduces and/or prevents electroplating solution leakage through the gap 407 between the cup member 401 and the insert member 403, and therefore provides improved electroplating solution cross-flow and improved electroplating solution convection within features on the wafer 109. This improved electroplating solution cross-flow and convection corresponds to improved plating performance on the wafer 109, such as improved WiF uniformity and skirting reduction. The improved electroplating solution convection also enables better ion transport to feature bottoms on the wafer 109, which can enable higher plating rates and increase overall wafer 109 fabrication throughput.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing disclosure has been presented in some detail for purposes of clarity of understanding, it will be apparent that certain changes and modifications can be practiced within the scope of the embodiments disclosed herein. Accordingly, the present embodiments are to be considered as illustrative and not restrictive, and the disclosure is not to be limited to the details given herein, but may be modified within the scope and equivalents of the described embodiments.

What is claimed is:

1. An apparatus for electroplating a semiconductor wafer, comprising:
    an insert member configured to circumscribe a processing region, the insert member having a top surface, a portion of the top surface of the insert member having an upward slope that slopes upward from a peripheral area of the top surface of the insert member toward the processing region; and
    a seal member having an annular-disk shape, the seal member positioned on the top surface of the insert member, the seal member being flexible such that an outer radial portion of the seal member conforms to the upward slope of the top surface of the insert member and such that an inner radial portion of the seal member projects inward toward the processing region.

2. The apparatus as recited in claim 1, wherein the inner radial portion of the seal member projects toward the processing region at an upward angle relative to horizontal when the seal member is positioned on the top surface of the insert member.

3. The apparatus as recited in claim 1, wherein the inner radial portion of the seal member projects inward toward the processing region from an apex of the top surface of the insert member, and wherein the inner radial portion of the seal member is configured to flex downward about the apex of the top surface of the insert member when a downward force is applied to a top surface of the inner radial portion of the seal member.

4. The apparatus as recited in claim 1, wherein the seal member is formed of polytetrafluoroethylene.

5. The apparatus as recited in claim 1, wherein the seal member has a coefficient of friction less than about 0.5.

6. The apparatus as recited in claim 1, further comprising:
    a clamp ring configured to hold the seal member against the top surface of the insert member at a location radially outside of the upward slope of the top surface of the insert member.

7. The apparatus as recited in claim 1, further comprising:
    a backing member disposed between the seal member and the top surface of the insert member, the backing member having a shape that is substantially equivalent to the annular-disk shape of the seal member.

8. The apparatus as recited in claim 7, wherein the backing member is configured to apply a resistive upward force through the seal member when a downward force is applied to a top surface of the inner radial portion of the seal member, and wherein the backing member is configured to prevent a flow of electroplating solution against a bottom surface of the inner radial portion of the seal member.

9. The apparatus as recited in claim 7, wherein the backing member is formed of spring stainless steel.

10. The apparatus as recited in claim 7, further comprising:
    a clamp ring configured to hold both the seal member and the backing member against the top surface of the insert member at a location radially outside of the upward slope of the top surface of the insert member.

11. The apparatus as recited in claim 1, further comprising:
    a cup member having an annular shape, the cup member having a bottom surface that includes an outer radial portion configured to form a liquid seal with a top surface of the inner radial portion of the seal member when the cup member is substantially centered over the seal member and moved downward to contact the seal member.

12. The apparatus as recited in claim 11, wherein the cup member is configured to rotate relative to the seal member when the cup member is substantially centered over the seal member and moved downward to contact the seal member, such that the outer radial portion of the bottom surface of the cup member is configured to slide on the top surface of the inner radial portion of the seal member while maintaining the liquid seal with the top surface of the inner radial portion of the seal member.

13. A method for electroplating a semiconductor wafer, comprising:
    having an electroplating apparatus that includes an insert member configured to circumscribe a processing region, the insert member having a top surface, a portion of the top surface of the insert member having an upward slope that slopes upward from a peripheral area of the top surface of the insert member toward the processing region,
    the electroplating apparatus also including a seal member having an annular-disk shape, the seal member positioned on the top surface of the insert member, the seal member being flexible such that an outer radial portion of the seal member conforms to the upward slope of the top surface of the insert member and such that an inner radial portion of the seal member projects inward toward the processing region,
    the electroplating apparatus also including a cup member having an annular shape, the cup member having a bottom surface that includes an outer radial portion configured to form a liquid seal with a top surface of the inner radial portion of the seal member when the cup member is substantially centered over the seal member and moved downward to contact the seal member;
    moving the cup member downward to form the liquid seal between the outer radial portion of the bottom surface of the cup member and the top surface of the inner radial portion of the seal member; and flowing electroplating solution through the processing region, a portion of the electroplating solution flowing against a bottom surface of the inner radial portion of the seal member and pressing the seal member against the cup member to assist with maintaining the liquid seal between the outer radial portion of the bottom surface of the cup member and the top surface of the inner radial portion of the seal member.

14. The method as recited in claim 13, further comprising:
    rotating the cup member relative to both the insert member and the seal member such that the outer radial portion of the bottom surface of the cup member slides on the top surface of the inner radial portion of the seal member while maintaining the liquid seal between the outer radial portion of the bottom surface of the cup member and the top surface of the inner radial portion of the seal member.

\* \* \* \* \*